US012609436B2

(12) United States Patent
Kim et al.

(10) Patent No.: US 12,609,436 B2
(45) Date of Patent: Apr. 21, 2026

(54) ANTENNA APPARATUS

(71) Applicant: KMW INC., Hwaseong-si (KR)

(72) Inventors: Duk Yong Kim, Yongin-si (KR); Kyo Sung Ji, Hwaseong-si (KR); Chi Back Ryu, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 110 days.

(21) Appl. No.: 18/389,274

(22) Filed: Nov. 14, 2023

(65) Prior Publication Data

US 2024/0079755 A1     Mar. 7, 2024

Related U.S. Application Data

(63) Continuation of application No. PCT/KR2022/006860, filed on May 13, 2022.

(30) Foreign Application Priority Data

May 14, 2021   (KR) ........................ 10-2021-0062957
May 13, 2022   (KR) ........................ 10-2022-0058700

(51) Int. Cl.
    *H01Q 1/02*         (2006.01)
    *H01Q 1/42*         (2006.01)
    *H05K 7/20*         (2006.01)
(52) U.S. Cl.
    CPC ................. *H01Q 1/02* (2013.01); *H01Q 1/42* (2013.01); *H05K 7/20409* (2013.01)
(58) Field of Classification Search
    None
    See application file for complete search history.

(56) References Cited

U.S. PATENT DOCUMENTS 5,898,412 A     4/1999   Jones et al.
6,126,128 A    10/2000   Costa et al.
       (Continued)

FOREIGN PATENT DOCUMENTS

JP       2017-046121 A     3/2017
KR       10-1496213 A      2/2015
       (Continued)

OTHER PUBLICATIONS

International Search Report mailed Aug. 22, 2022 for International Application No. PCT/KR2022/006860 and its English translation.
       (Continued)

*Primary Examiner* — Crystal L Hammond

(57)          ABSTRACT

The present invention relates to an antenna apparatus, particularly comprising: an antenna housing portion which has a predetermined installation space formed therein and is provided with a plurality of front heat dissipation fins protruding to at least one side of the front surface thereof; a main board which is stacked on the installation space of the antenna housing portion and has predetermined heating elements arranged on the front surface thereof, and is mounted to be in thermal contact with the front surface of the antenna housing portion provided with the plurality of front heat dissipation fins; a plurality of filters which form a predetermined layer in front of the main board, and are stacked in a middle portion except for the portion where the plurality of front heat dissipation fins are formed; an antenna element assembly including a plurality of radiation elements stacked in front of the plurality of filters; and an installation plate which is fixed to be in face-to-face contact with the rear surface of the antenna housing portion and services as a medium for the face-to-face installation on a perpendicularly arranged installation wall surface to thereby provide the (Continued)

advantage of the reducing the spatial constraints on the installation wall surface.

13 Claims, 9 Drawing Sheets

(56)                    References Cited

U.S. PATENT DOCUMENTS

| | | | |
|---|---|---|---|
| 10,283,849 B2 * | 5/2019 | Hirata | ...................... H04B 1/38 |
| 2013/0222201 A1 | 8/2013 | Ma et al. | |
| 2018/0219277 A1 | 8/2018 | Hirata et al. | |

FOREIGN PATENT DOCUMENTS

| | | | |
|---|---|---|---|
| KR | 101496213 B1 * | 2/2015 | ........... H01Q 1/3225 |
| WO | 2018-194425 A1 | 10/2018 | |
| WO | 2021-054755 A1 | 3/2021 | |

OTHER PUBLICATIONS

European Search Report dated Apr. 3, 2025 from European Patent Office for Application No. 22807870.5.

* cited by examiner

ANTENNA APPARATUS

CROSS-REFERENCE TO RELATED APPLICATIONS

This application is a continuation application of International Application No. PCT/KR2022/006860, filed May 13, 2022, which claims the benefit of Korean Patent Application Nos. 10-2021-0062957, filed May 14, 2021; and 10-2022-0058700, filed May 13, 2022, in the Korean Intellectual Property Office, the disclosures of which are incorporated herein in their entirety by reference.

TECHNICAL FIELD

The present disclosure relates to an antenna apparatus, and more particularly, to an antenna device which facilitates installation on an indoor or outdoor wall surface by disposing a heat dissipation structure for concentrated heat dissipation to a front part of an antenna housing part and removing rear heat dissipation fins.

BACKGROUND ART

In general, an antenna apparatus includes a main board on which predetermined heating elements are sequentially mounted from an inner side of an antenna housing part to the front in an installation space of the antenna housing part formed with an open front, a plurality of filters stacked in front of the main board, and an antenna element board (or antenna element assembly) stacked in front of the plurality of filters.

Here, on a front surface of the antenna housing part, a radome may be installed to protect the main board stacked and disposed in an installation space of the antenna housing part, the plurality of filters, and a plurality of antenna elements.

Accordingly, in case of the antenna apparatus in the related art, due to the installed radome, a drive heat generated from the predetermined heating elements mounted on the main board is mostly dissipated to the rear through a plurality of rear heat dissipation fins provided on a rear surface of the antenna housing part.

However, according to the antenna apparatus in the related art, since it is required for the plurality of rear heat dissipation fins for dissipating the system drive heat to the rear of the antenna housing part to be formed in the rear of the antenna housing part, a separation space for air circulation is required between the rear heat dissipation fins and the installation wall surface, and this causes a problem in that product installation is limited due to restrictions, such as installation conditions. Further, according to the antenna apparatus according to the related art, since it is required for the plurality of rear heat dissipation fins for dissipating the system drive heat to the rear of the antenna housing part to be formed to be integrated into the antenna housing part and to project rearward, the installation space at least as much as the volume occupied by the rear heat dissipation fins is required, and this causes a problem in that the installation of the antenna apparatus on an installation wall surface of public facilates, such as a subway, is limited.

DISCLOSURE

Technical Problem

The present disclosure has been devised to solve the above technical problems, and an object of the present disclosure is to provide an antenna apparatus, which can reduce restrictions on an installation space against an indoor or outdoor installation wall surface.

Another object of the present disclosure is to provide an antenna apparatus, which can not only distribute, design, and dispose inner components according to their heat generation amounts at locations having different heat dissipation performances, but also maximize the heat dissipation performance to the front by minimizing an area of an antenna element assembly that is protected by a radome in the related art.

The technical problems of the present disclosure are not limited to the above-described technical problems, and other unmentioned technical problems may be clearly understood by those skilled in the art from the following descriptions.

Technical Solution

In one embodiment of the present disclosure, an antenna apparatus includes: an antenna housing part having a front surface on which a plurality of front heat dissipation fins are integrally formed; an antenna element assembly stacked and disposed on the front surface of the antenna housing part, and disposed to be exposed to the front between the plurality of front heat dissipation fins formed on a left side part and a right side part of the antenna housing part; a plurality of filters disposed on a rear part of the antenna element assembly, and disposed in an installation space inside the antenna housing part; and an installation plate having a front surface fixed in surface contact with rear surfaces of the antenna housing parts and a rear surface installed in surface contact with an installation wall surface to mediate the installation of the antenna housing part.

In another embodiment of the present disclosure, an antenna apparatus includes: an antenna housing part having a predetermined installation space formed therein and provided with a plurality of front heat dissipation fins protruding to at least one side of a front surface thereof; a main board stacked and disposed in the installation space of the antenna housing part, having predetermined heating elements mounted and disposed on a front surface thereof, and mounted to be in thermal contact with the front surface of the antenna housing part provided with the plurality of front heat dissipation fins; a plurality of filters configured to form a predetermined layer in front of the main board and stacked and disposed on a middle portion excluding a place where the plurality of front heat dissipation fins are formed; an antenna element assembly provided with a plurality of radiation elements stacked and disposed in front of the plurality of filters; and an installation plate fixed to be in surface contact with a rear surface of the antenna housing part and configured to mediate a surface contact installation on a vertically disposed installation wall surface.

In still another embodiment of the present disclosure, an antenna apparatus includes: an antenna housing part having a predetermined installation space formed therein and provided with a plurality of front heat dissipation fins protruding from left and right side parts to the front around a middle portion of a front surface thereof, the plurality of front heat dissipation fins being divided into two places; a main board stacked and disposed in the installation space of the antenna housing part, having predetermined heating elements mounted and disposed on a front surface thereof, and mounted to be in thermal contact with an inner surface of the antenna housing part provided with the plurality of front heat dissipation fins; a plurality of filters configured to form a predetermined layer in front of the main board and stacked and disposed on a middle portion excluding the place where the plurality of front heat dissipation fins are formed; an antenna element assembly provided with a plurality of radiation elements stacked and disposed on the front surface of the antenna housing part corresponding to the front of the plurality of filters; and an installation plate fixed to be in surface contact with a rear surface of the antenna housing part and configured to mediate a surface contact installation on a vertically disposed installation wall surface.

Here, the antenna housing part may include a front housing having a border end part protruding to the front as much as a front protrusion height of the plurality of front heat dissipation fins, and a front protrusion accommodation part formed thereon and configured to accommodate the plurality of filters and a plurality of antenna element assemblies therein; and a rear housing disposed to cover an open rear surface of the front housing and configured to be in surface contact with a front surface of the installation plate.

Further, the antenna apparatus may further include a radome combined with the border end part that is a front end of the front protrusion accommodation part of the front housing.

Further, the front protrusion accommodation part may be provided with a shield panel configured to divide the plurality of filters disposed relatively in the rear and the antenna element assembly disposed relatively in the front from each other.

Further, the front protrusion accommodation part may be formed in the middle that is between the plurality of front heat dissipation fins provided in the two places, and may be formed long in an up and down direction.

Further, the plurality of front heat dissipation fins may be vertically formed long in an up and down direction, and may be formed to be spaced apart for a predetermined distance from the adjacent front heat dissipation fins in a left and right direction.

Further, at least one screw fastening hole may be formed on the installation plate, and on a border of the front housing, a screw fastening end for fastening an assembly screw may be formed at a location corresponding to the screw fastening hole.

Further, at the screw fastening end, a screw locking groove, which is locked in a gravity direction in a head part protruding in the front after the installation plate is fixed so that a rear surface thereof comes in surface contact with the installation wall surface by the assembly screw, may be formed in a downwardly open "U" shape.

Further, the installation plate may be formed in the shape of a vertical panel that comes in surface contact with even the installation wall surface, and may be made of a thermally conductive material.

Further, the heating element mounted on the main board may be mounted so that a front surface thereof comes in thermal surface contact with a rear surface thereof corresponding to an immediate rear of the plurality of front heat dissipation fins of the front housing.

Further, the heating element mounted on the main board may include a first heating element group disposed in the immediate rear of the left heat dissipation fins formed on a left side part among the plurality of front heat dissipation fins, and a second heating element group disposed in the immediate rear of the right heat dissipation fins formed on a right side part among the plurality of front heat dissipation fins; and on a rear part of the front housing, a plurality of heat transfer grooves corresponding to front protrusion shapes of the first heating element group and the second heating element group may be integrally processed and formed.

Further, a PSU board may be disposed on a lower part of the main board side by side, and a PSU related element mounted on the PSU board may have a front surface that is disposed to be in close contact with a rear part of the front housing.

Advantageous Effects

According to the antenna apparatus according to an embodiment of the present disclosure, the antenna apparatus can be installed in a manner that the rear surface of the antenna housing part is closely disposed in front based on the installation plate, and the front surface of the installation wall is closely disposed in the rear based on the installation plate, and thus the restrictions of the installation space can be reduced.

Further, according to the antenna apparatus according to an embodiment of the present disclosure, since the heating elements having a relatively large heat generation amount are designed to be disposed at the location where the plurality of front heat dissipation fins are formed, and the inner constitutions having a relatively small heat generation amount are designed to be disposed at the location where the plurality of front heat dissipation fins are not formed, the heat dissipation performance can be maximized even without forming the rear heat dissipation fins.

Figure 1:
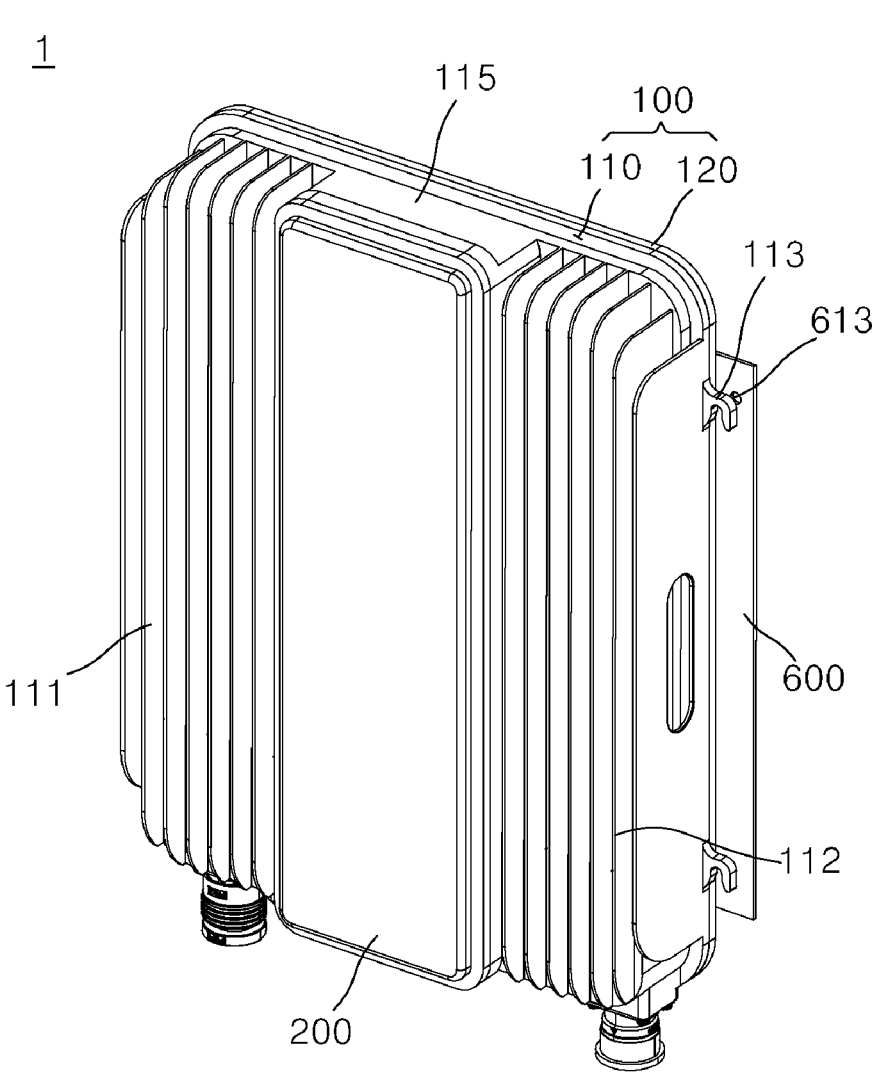
FIG. 1 is a perspective view of an antenna apparatus according to an embodiment of the present disclosure.

| [Explanation of symbols] | |
|---|---|
| 1: antenna apparatus | 100: antenna housing part |
| 110: front housing | 111: front heat dissipation fins |
| 113: screw fastening end | 115: front protrusion accommodation part |
| 115s: protrusion accommodation space | 116: filter accommodation groove |
| 200: radome | 300: antenna element assembly |
| 310: shield panel | 320: feed terminal |
| 330: radiation element | 400: board part |
| 410: main board | 420: PSU board |
| 500: filter | |

MODE FOR INVENTION

Hereinafter, an antenna apparatus according to an embodiment of the present disclosure will be described in detail with reference to the accompanying drawings.

In adding reference numerals to constituent elements in the drawings, it is to be noted that the same constituent elements have the same reference numerals as much as possible even if they are represented in different drawings. Further, in explaining embodiments of the present disclosure, the detailed explanation of related known configurations or functions will be omitted if it is determined that the detailed explanation interferes with understanding of the embodiments of the present disclosure.

The terms, such as "first, second, A, B, (a), and (b)", may be used to describe constituent elements of embodiments of the present disclosure. The terms are only for the purpose of discriminating one constituent element from another constituent element, but the nature, the turn, or the order of the corresponding constituent elements is not limited by the terms. Further, unless otherwise defined, all terms (including technical and scientific terms) used herein have the same meanings as those commonly understood by those ordinary skilled in the art to which the present disclosure belongs. The terms that are defined in a generally used dictionary should be interpreted as meanings that match with the meanings of the terms from the context of the related technology, and they are not interpreted as an ideal or excessively formal meaning unless clearly defined in the present disclosure.

Figure 2:
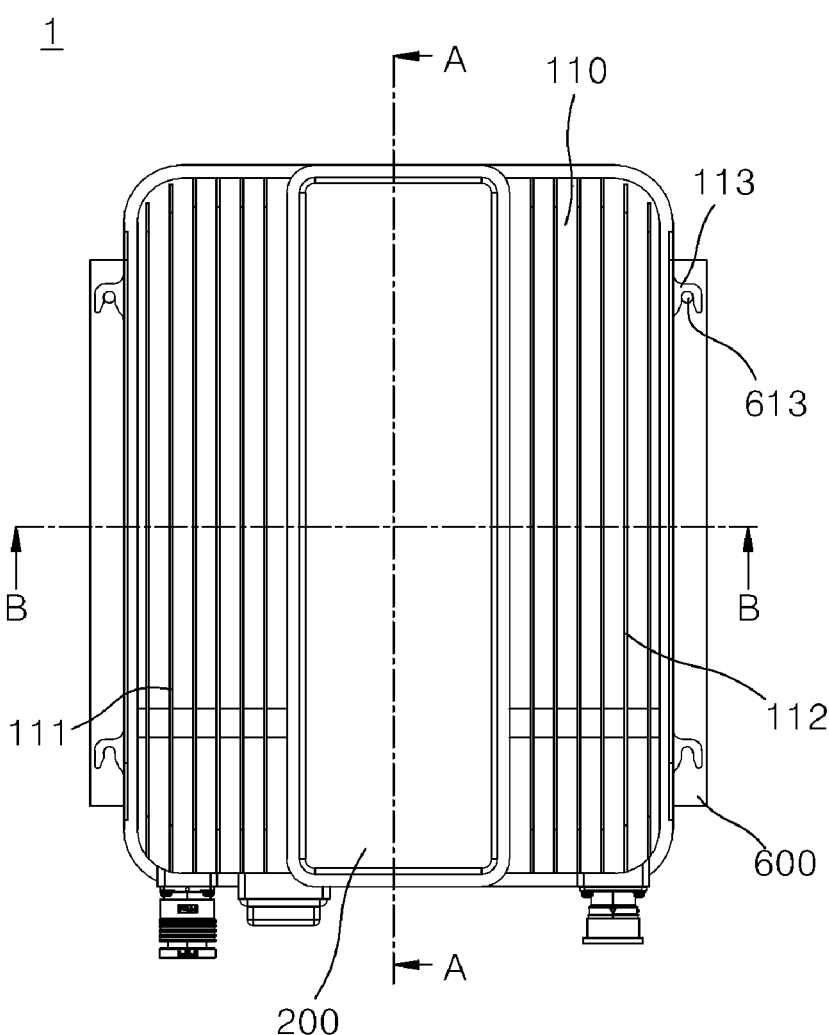
FIG. 2 is a front view of FIG. 1.
Figure 3:
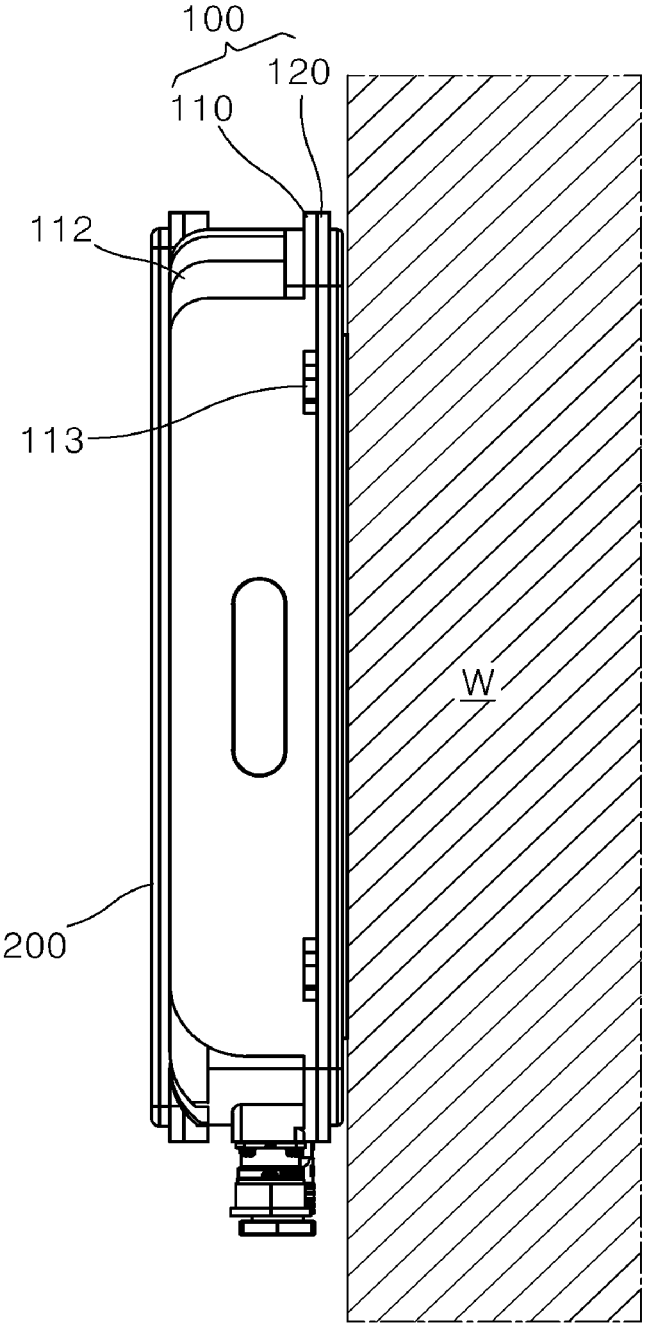
FIG. 3 is a side view illustrating an installation shape against an installation wall surface of FIG. 1.

FIG. 1 is a perspective view of an antenna apparatus according to an embodiment of the present disclosure, and FIG. 2 is a front view of FIG. 1. FIG. 3 is a side view illustrating an installation shape against an installation wall surface of FIG. 1.

As referenced in FIGS. 1 to 3, an antenna apparatus 1 according to an embodiment of the present disclosure includes: an antenna housing part 100 having a front surface on which a plurality of front heat dissipation fins 111 and 112 are integrally formed; an antenna element assembly 300 stacked and disposed on the front surface of the antenna housing part 100, and disposed to be exposed to the front between the plurality of front heat dissipation fins 111 and 112 formed on a left side part and a right side part of the antenna housing part 100; a plurality of filters 500 disposed on a rear part of the antenna element assembly 300, and disposed in an installation space 110s inside the antenna housing part 100; and an installation plate 600 having a front surface fixed in surface contact with rear surfaces of the antenna housing parts 100 and a rear surface installed in surface contact with an installation wall surface W to mediate the installation of the antenna housing part 100.

However, embodiments of the present disclosure are not necessarily defined by the antenna apparatus 1 according to an embodiment as described above. As described later, it is apparent that the antenna apparatus 1 according to an embodiment of the present disclosure may be defined as another embodiment and still another embodiment.

More specifically, an antenna apparatus 1 according to another embodiment of the present disclosure includes: an antenna housing part 100 having a predetermined installation space 110s formed therein and provided with a plurality of front heat dissipation fins 111 and 112 protruding from left and right side parts (i.e., left side part and right side part) to the front around a middle portion of a front surface thereof, the plurality of front heat dissipation fins 111 and 112 being divided into two places; a main board 410 stacked and disposed in the installation space 110s of the antenna housing part 100, having predetermined heating elements (not illustrated) mounted and disposed on a front surface thereof, and mounted to be in thermal contact with the front surface of the antenna housing part 100 provided with the plurality of front heat dissipation fins 111 and 112; a plurality of filters 500 configured to form a predetermined layer in front of the main board 410 and stacked and disposed on a middle portion excluding the place where the plurality of front heat dissipation fins 111 and 112 are formed; an antenna element assembly 300 provided with a plurality of radiation elements 330 stacked and disposed in front of the plurality of filters 500; and an installation plate 600 fixed to be in surface contact with a rear surface of the antenna housing part 100 and configured to mediate a surface contact installation on a vertically disposed installation wall surface W.

Further, an antenna apparatus 1 according to still another embodiment of the present disclosure may be defined to include: an antenna housing part 100 having a predetermined installation space 110s formed therein and provided with a plurality of front heat dissipation fins 111 and 112 protruding from left and right side parts (i.e., left side part and right side part) to the front around a middle portion of a front surface thereof, the plurality of front heat dissipation fins 111 and 112 being divided into two places; a main board 410 stacked and disposed in the installation space 110s of the antenna housing part 100, having predetermined heating elements mounted and disposed on a front surface thereof, and mounted to be in thermal contact with an inner surface of the antenna housing part 100 provided with the plurality of front heat dissipation fins 111 and 112; a plurality of filters 500 configured to form a predetermined layer in front of the main board 410 and stacked and disposed on a middle portion excluding the place where the plurality of front heat dissipation fins 111 and 112 are formed; an antenna element assembly 300 provided with a plurality of radiation elements stacked and disposed on the front surface of the antenna housing part 100 corresponding to the front of the plurality of filters 500; and an installation plate 600 fixed to be in surface contact with a rear surface of the antenna housing part 100 and configured to mediate a surface contact installation on a vertically disposed installation wall surface W.

Figure 4A:
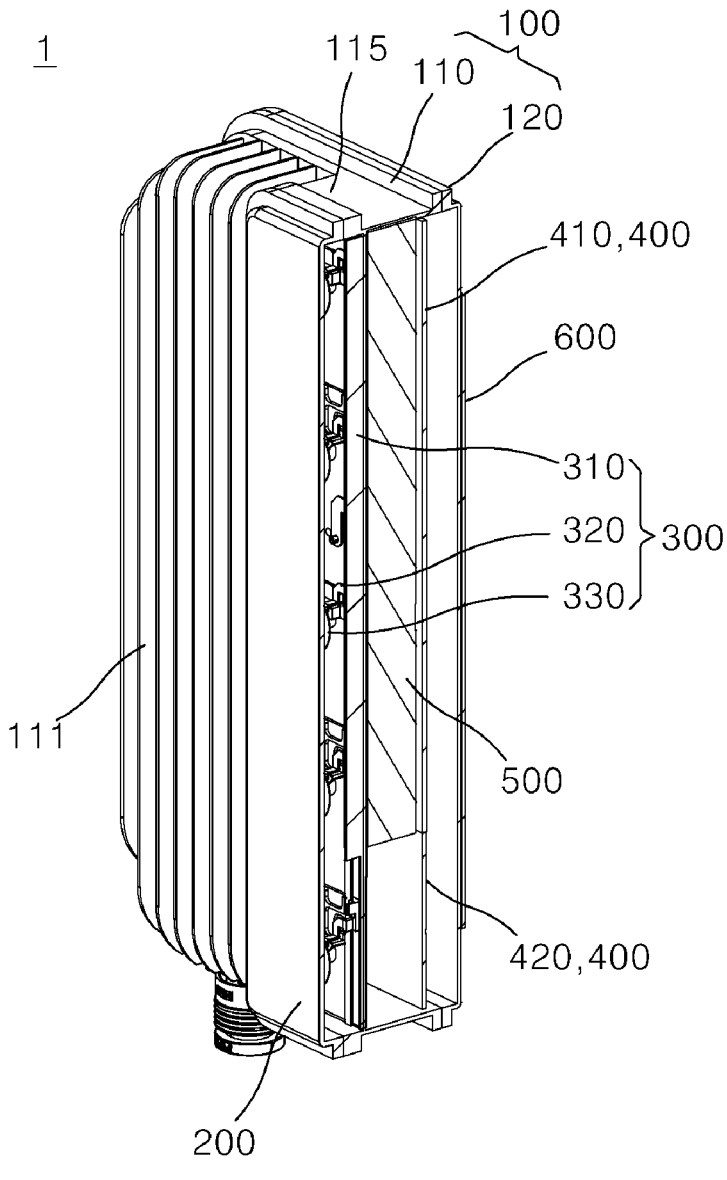
FIGS. 4A and 4B are cutaway perspective views taken along lines A-A and B-B of FIG. 2.
Figure 4B:
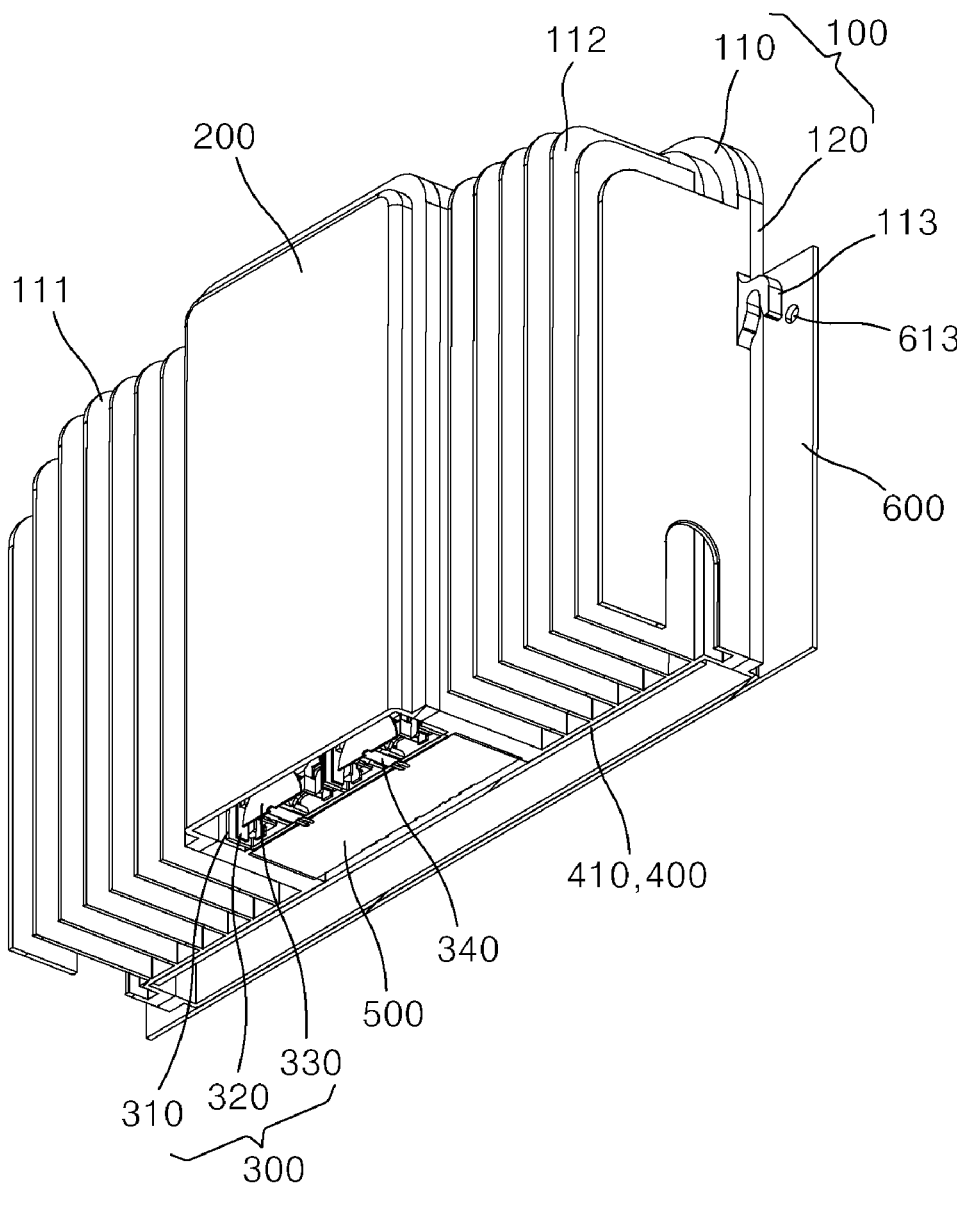
Figure 5A:
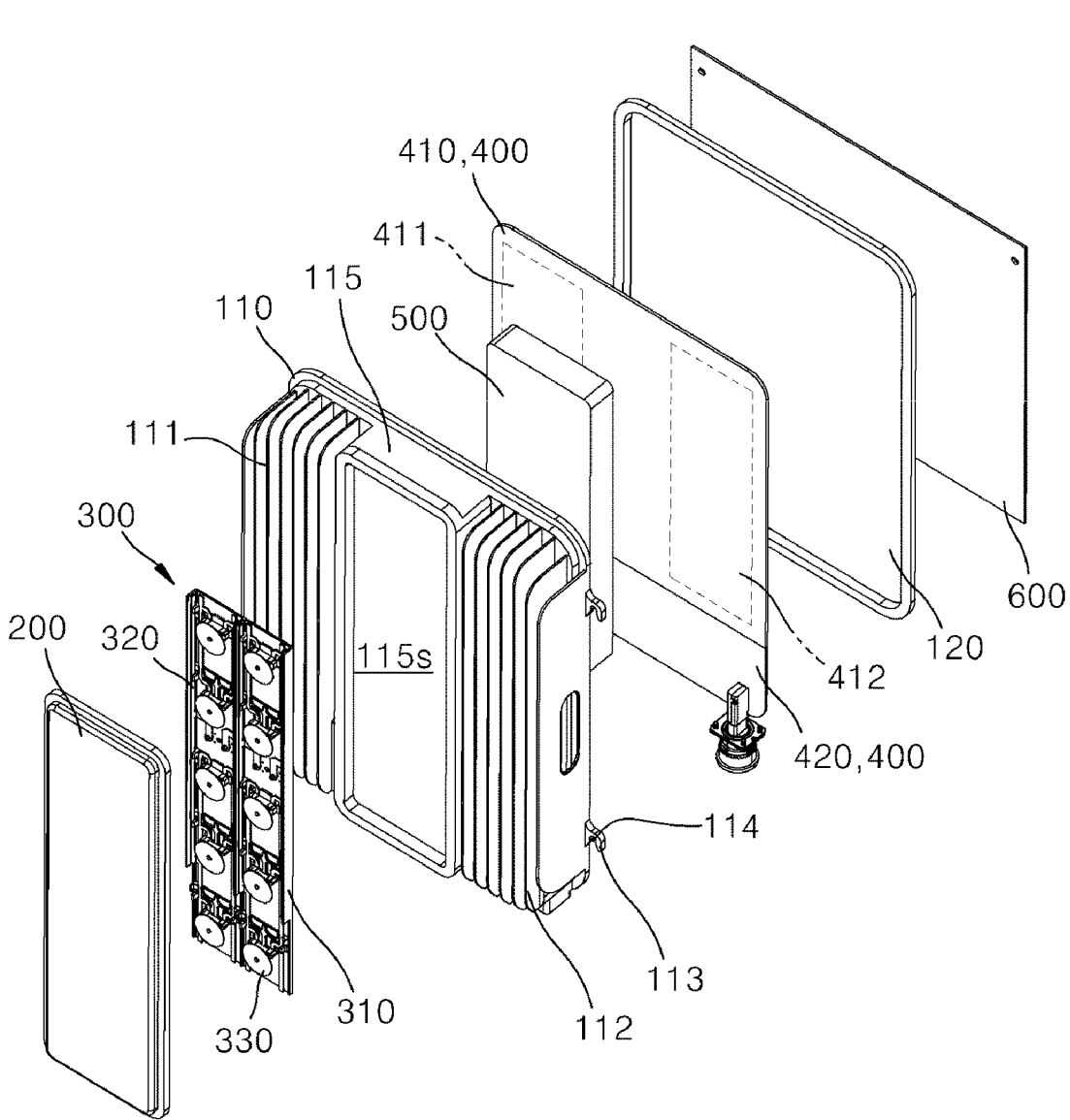
FIGS. 5A and 5B are exploded perspective views of a front part and a rear part of FIG. 1.
Figure 5B:
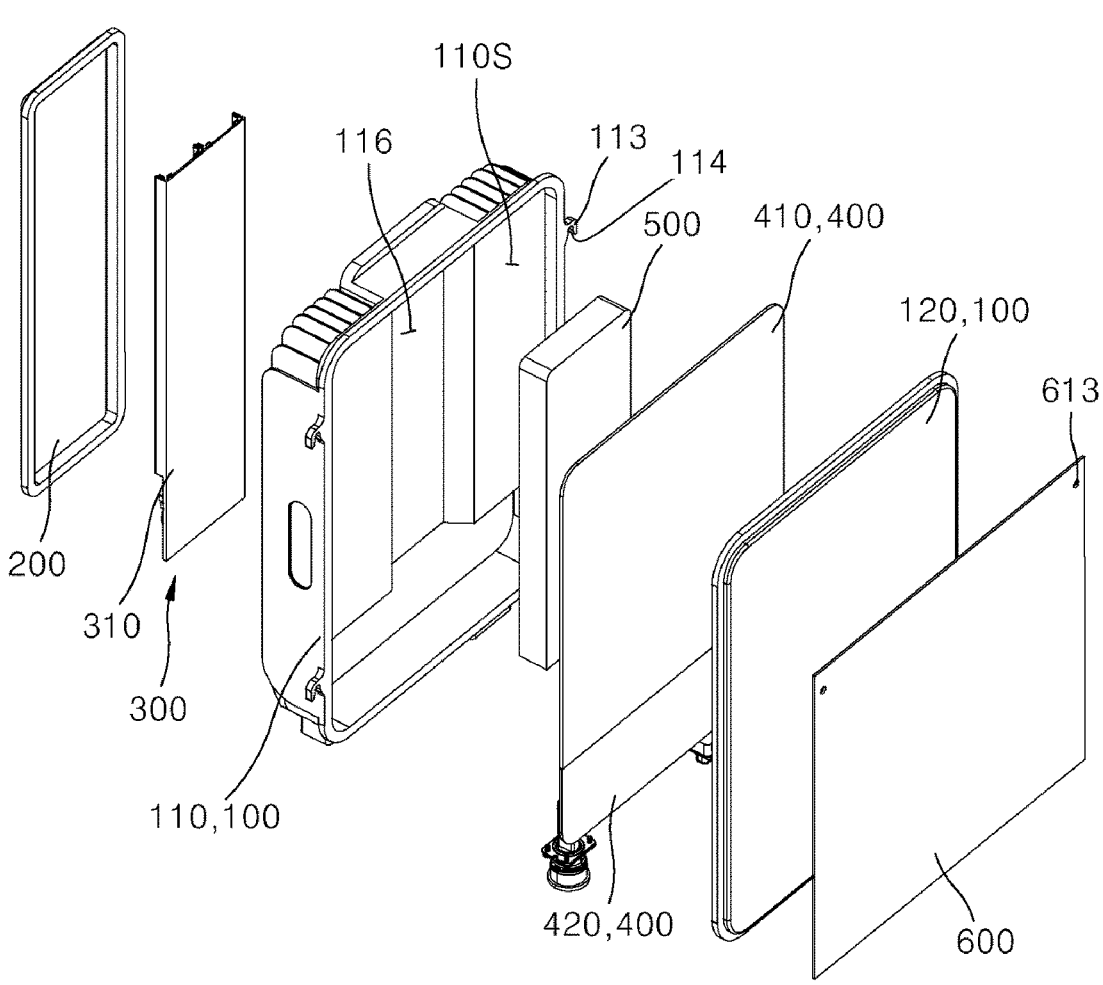

FIGS. 4A and 4B are cutaway perspective views taken along lines A-A and B-B of FIG. 2, and FIGS. 5A and 5B are exploded perspective views of a front part and a rear part of FIG. 1.

Hereinafter, the detailed constitution and working effects of an antenna apparatus 1 according to the present disclosure implemented by three kinds of embodiments as described above will be described in detail.

For reference, the main board 410 may correspond to a board part 400 that forms one layer on an inner surface of the antenna housing part 100 together with a PSU board 420 to be described later.

Here, the antenna housing part 100 may include a front housing 110 protruding to the front as much as a front protrusion height of the plurality of front heat dissipation fins 111 and 112, and having a front protrusion accommodation part 115 formed thereon and configured to accommodate the plurality of filters 500 and the plurality of antenna element assemblies 300 therein, and a rear housing 120 disposed to cover an open rear surface of the front housing 110 and configured to be in surface contact with a front surface of the installation plate 600. Accordingly, it may be interpreted that the "rear surface" of the antenna housing part 100 is referred to as the rear surface of the rear housing 120, and the "inner surface" of the antenna housing part 100 is referred to as the rear surface of the front housing 110 or the front surface of the rear housing 120, which forms the installation space 110s.

Unlike the antenna apparatus in the related art, in which as the antenna element assembly (or radiation element) is disposed on the front part of the product, the filters and the main board are sequentially stacked and arranged in order in the rear, and thus the plurality of rear heat dissipation fins are essentially formed on the side of the rear housing on which the main board that generates the most operation heating is disposed, the antenna apparatus 1 according to embodiments of the present disclosure may be formed to have only a vertical surface that is in surface contact with the front surface of the installation plate 600 in a state where the rear heat dissipation fins for heat dissipation is not provided on the rear surface of the rear housing 120.

In case that the plurality of rear heat dissipation fins are not provided on the rear surface side of the rear housing 120, the antenna housing part 100 can be combined with and fixed to the installation wall surface W more closely through the direct medium of the installation plate 600 to be described later, and thus the installation space can be easily secured during the antenna installation.

Meanwhile, the antenna apparatus 1 according to embodiments of the present disclosure may further include a radome 200 that is combined with the front end of the front protrusion accommodation part 115 of the front housing 110.

Here, the antenna apparatus according to embodiments of the present disclosure is different from the antenna apparatus in the related art on the point that the radome 200 of the antenna apparatus according to the embodiments of the present disclosure is provided to cover only the front protrusion accommodation part 115 formed to protrude to the front on the middle portion of the plurality of front heat dissipation fins 111 and 112 provided on the two places of the left side part and the right side part of the antenna housing part 100, whereas the radome of the antenna apparatus in the related art is provided to cover the entire front surface of the antenna housing part.

This may be the feature of mechanical design changes in interlock with the technological trends of capable of reducing the installation area of the antenna element assembly 300 as the cell size is miniaturized by a small cell network (SCN) technology that is one of various applied technology candidates heightening the frequency efficiency in the recent 5G cellular network. That is, in case of the technologies in the related art, such as massive MIMO or full dimensional MIMO (FD-MIMO), the installation area becomes huge as the number of radiation elements adopted in the antenna element assembly 300 is exponentially increased, and the antenna apparatus in the related art has limitations in that it has no choice but to perform concentrated heat dissipation of the system heat according to the driving of the antenna apparatus to the rear on the point that the radome 200 should be disposed to cover the entire antenna element assembly 300.

As described above, the antenna apparatus 1 according to embodiments of the present disclosure has the advantage that the system heat generated from the heating elements mounted on the main board 410 is dissipated to the front by using the plurality of front heat dissipation fins 111 and 112 formed to protrude to the front of the antenna housing part 100, and thus the antenna apparatus 1 can be easily installed even in case of the narrow installation space on the installation wall surface W.

More specifically, at least one screw fastening hole 613 may be formed on the installation plate 600, and on a border of the front housing 110, a screw fastening end 113 for fastening an assembly screw (not illustrated) may be formed at a location corresponding to the screw fastening hole 613.

The assembly screw may be used not only to fix the installation plate 600 onto the installation wall surface W but also to stably mount or combine the antenna housing part 100 on or with the installation plate 600 by locking a head part of the assembly screw in a front end of the screw fastening end 113 to be described later.

For the mount or combination with the installation plate 600 of the antenna housing part 100, as referenced in FIG. 2, a screw locking groove 114 may be formed in a downwardly open "U" shape at the screw fastening end 113.

For stable installation on the installation plate 600 of the antenna housing part 100, the assembly screw is first provisionally assembled into the screw fastening hole 613, and the head part of the assembly screw is provisionally fastened onto the front surface of the installation plate 600 to be spaced apart for a predetermine distance from each other without being completely in close contact with the front surface of the installation plate 600. Thereafter, the screw locking groove 114 of the screw fastening end 113 formed on the border of the front housing 110 of the antenna housing part 100 moves from top to bottom and is mounted to be locked in the body part excluding the head part of the assembly screw, and then the assembly screw is firmly fastened by using a fastening tool, such as a driver, so that the head part of the assembly screw is stably and closely combined with the front surface of the screw fastening end 113.

Here, the installation plate 600 may be formed in the shape of a vertical panel that comes in surface contact with even the installation wall surface W, and may be made of a thermally conductive material. Since the rear surface of the installation plate 600 is formed to be in surface contact with the installation wall surface W, the space between the rear surface of the rear housing 120 of the antenna housing part 100 and the installation wall surface W can be reduced to minimum, and the heat being transferred through a vertical surface of the rear housing 120 made of a thermally conductive material can also be easily transferred (dissipated) to the rear by the above material properties of the thermally conductive material.

Further, as referenced in FIGS. 2 to 4B, it is preferable that the installation plate 600 is formed to have a left and right width that is at least larger than the left and right width of the rear housing 120 so that the heat transferred from the rear housing 120 is smoothly dissipated to outside through the left side part or the right side part.

Meanwhile, the front protrusion accommodation part 115 is formed in the middle that is between the plural front heat dissipation fins 111 and 112 provided in two places, and preferably, is formed long in an up and down direction.

More specifically, as referenced in FIG. 5B, an installation space 110S for installing the main board 410 therein may be formed between the front housing 110 and the rear housing 120, and as a filter accommodation groove 116, to be described later, that communicates with the installation space 110S in which the main board 410 is installed is formed, a front border end part may be formed to protrude to the front of the front housing 110.

In the same manner, inside the front protrusion accommodation part 115, the filter accommodation groove 116 that is a space in which the plurality of filters 500 are disposed may be formed, and in the same manner as the front protrusion accommodation part 115, the filter accommodation groove 116 and the plurality of filters 500 disposed therein may be formed or disposed long in the up and down direction, and the antenna element assembly 300 stacked onto the front surface of the plurality of filters 500 may also disposed long in the up and down direction.

The plurality of filters 500 are a plurality of cavity filter assemblies provided with resonators (not illustrated) in a plurality of cavities, and may be disposed on the front surface of the main board 410 to form one layer.

More specifically, the filter accommodation groove 116 that is provided in a groove shape may be formed on the rear surface of the front housing 110 corresponding to the front surface of the main board 410 so that the plurality of filters 500 are fitted together, and the plurality of filters 500 may be installed in the form of being inserted into the filter accommodation groove 116.

The main board 410 may be stacked and disposed in the installation space 110S between the front housing 110 and the rear housing 120 among the constitutions of the antenna housing part 100.

Here, on the front surface of the main board 410, analog amplification elements (e.g., PA element and LNA element) may be mounted and disposed as main heating elements. The analog amplification elements are main heating elements that generate the most heat during the system operation of the antenna apparatus, and in case that the heat is not released from but is accumulated in the installation space 1105 of the antenna housing part 100, this may be the main cause of deteriorating the performance of the entire antenna apparatus.

Accordingly, although all the heating elements may be mounted on both surfaces of the main board 41, it is beneficial for the heat dissipation to mount the heating elements having a relatively large heat generation amount among the heating elements on the front surface that faces the rear surface of the front housing 110, and to mount the heating elements having a relatively small heat generation amount among the heating elements on the rear surface that faces the front surface of the rear housing 120.

In this case, as referenced in FIG. 5A, on the front surface of the front housing 110, the plurality of front heat dissipation fins 111 and 112 are formed in two places as the first front heat dissipation fin part 111 of the left side part and the second front heat dissipation fin part 112 of the right side part around the middle, and the heating elements mounted on the front surface of the main board 410 are also formed in two places as the first heating element group 411 of the left side part and the second heating element group 412 of the right side part, and the respective heating element groups 411 and 412 may be designed to be in surface thermal contact with locations corresponding to the rear surface of the front heat dissipation fin parts 111 and 112.

The heat generated from the respective heating element groups 411 and 412 disposed to be in surface thermal contact with the rear surface corresponding to the locations where the respective front heat dissipation fin parts 111 and 112 may be directly transferred by heat conduction through the front housing 110 made of a metal material (or thermally conductive material), and then the high-level heating performance can be maintained through heat exchange with outdoor air through the front heat dissipation fin parts 111 and 112.

In contrast, the heat generated from the heating elements mounted on the rear surface of the main board 410 may be directly transferred by heat conduction through the rear housing 120 made of a metal material (or thermally conductive material), and then may be dissipated in the left and right direction of the rear housing 120 through the metal material (thermally conductive material) disposed in a surface contact manner.

Here, since it is enough to just form the installation space 110S that is larger than the thickness of the main board 410, slim design to minimize the thickness of the product in the forward and backward direction becomes possible. Meanwhile, the filter accommodation groove 116 may be provided in the form of a space that communicates with the installation space 1105. The plurality of filters 500 may be accommodated in the filter accommodation groove 116, and may be stacked and disposed on the front surface of the main board 410.

Meanwhile, on a lower part of the main board 410, a PSU board 420 may be provided, on which PSU elements (not illustrated), which are disposed side by side in a vertical direction so as to form the same layer and which are configured to supply a predetermined power to the plurality of filters 500 and the heating elements of the main board 410, are mounted.

Here, in the same manner as the heating elements mounted on the main board 410, it is preferable that the PSU elements mounted on the PSU board 420 are disposed to be in close contact with the rear surface of the front housing 110 for the surface thermal contact.

In addition, although not illustrated, on the rear surface of the front housing 110, heat transfer grooves, which are grooved to correspond to front protrusion shapes (external appearance) of the heating elements mounted on the front surface of the main board 410 and protruding to the front surface and the PSU elements mounted on the front surface of the PSU board 420 and protruding to the front, may be formed.

Figure 6A:
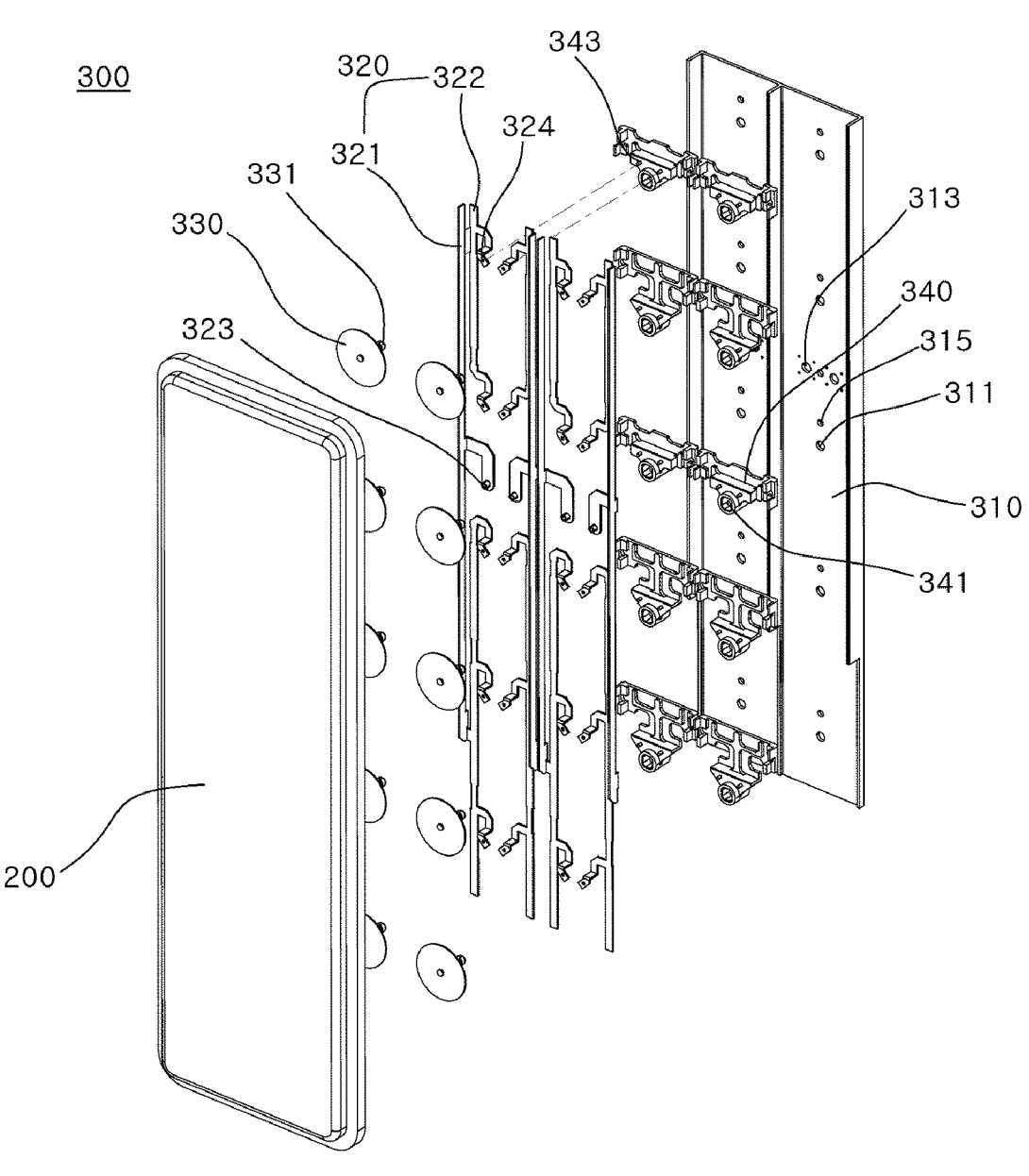
FIGS. 6A and 6B are front-side and rear-side exploded perspective views illustrating antenna element assemblies of constitutions of FIGS. 5A and 5B.
Figure 6B:
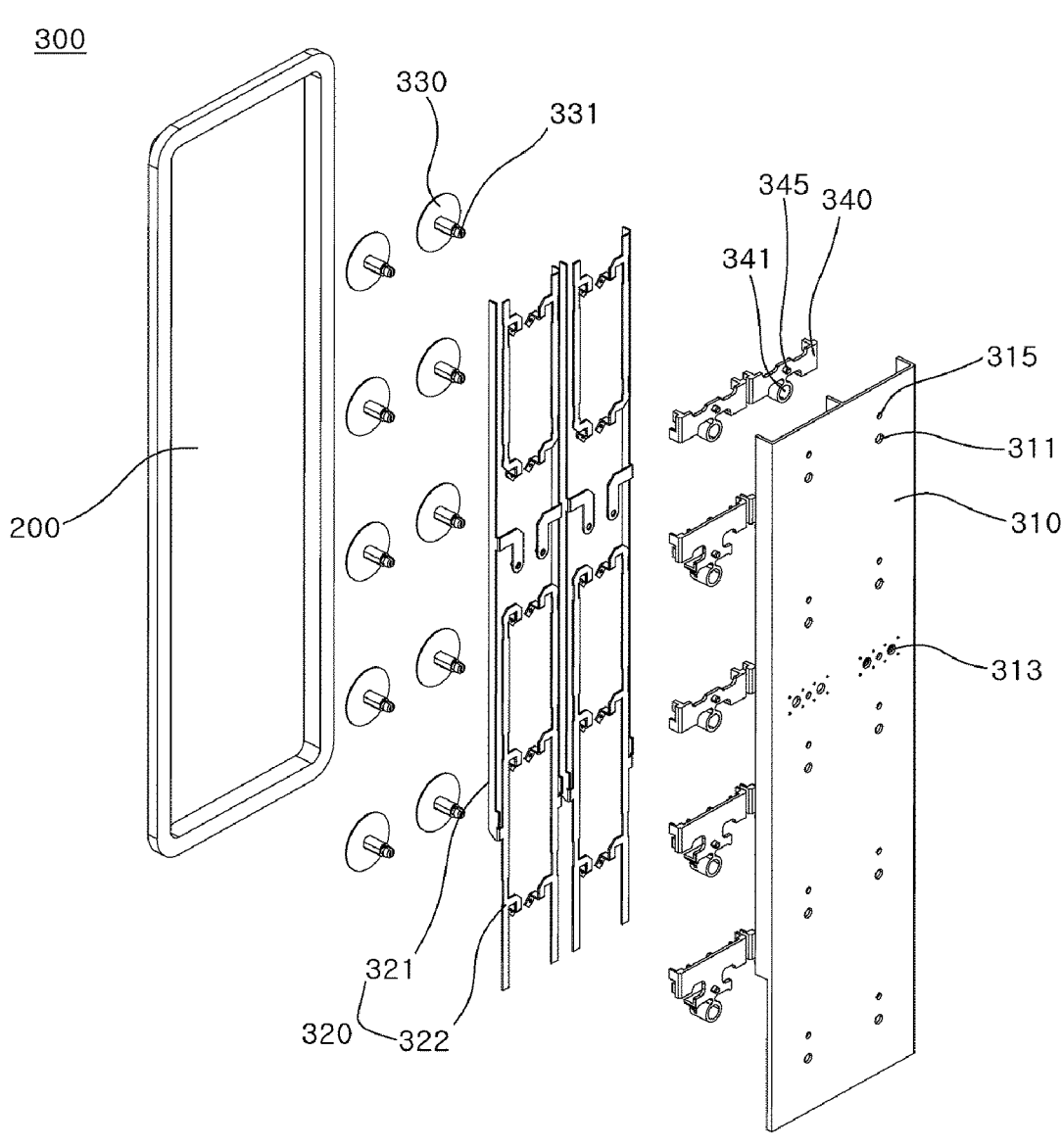

FIGS. 6A and 6B are front-side and rear-side exploded perspective views illustrating antenna element assemblies of constitutions of FIGS. 5A and 5B.

As referenced in FIGS. 6A and 6B, an antenna element assembly 300 may include a shield panel 310, a feed terminal 320 arranged on a front surface of the shield panel 310, and a plurality of radiation elements 330 provided to be able to be fed by the feed terminal 320.

More specifically, the shield panel 310 may be disposed inside the front protrusion accommodation part 115 of the front housing 110 among the constitutions of the antenna housing part 100, and may be disposed to shield the front surfaces of the plurality of filters 500 through division of the filter accommodation groove 116 in the front protrusion accommodation part 115 into front and rear. The shield panel 310 as described above is disposed dividedly from the plurality of filters 500, and thus may perform a function of preventing signal interferences between the plurality of radiation elements 330 among the constitutions of the antenna element assembly 300.

In addition, the shield panel 310 may serve as fixing elements for fixing the plurality of radiation elements 330 and the plurality of feed terminals 320 through a mounting holder 340 to be described later. As referenced in FIGS. 6A and 6B, the antenna element assembly 300 may further include a plurality of mounting holders 340 fixed to the front surface of the shield panel 310 and configured to mediate installations of the plurality of radiation elements 330 and the plurality of feed terminals 320.

The plurality of mounting holders 340 may be arranged to be spaced apart from each other in the up and down direction so that the radiation elements 330 are combined with the front thereof, and may be arranged at least in two rows in the left and right direction.

Here, since a location setting protrusion 345 is formed to protrude rearward on a rear surface part of the mounting holder 340, and a location setting hole 315, in which the location setting protrusion 345 is inserted, is formed on the shield panel 310, the plurality of mounting holders 340 can be temporarily fixed to the shield panel 310 through an operation of inserting the location setting protrusion 345 of the mounting holder 340 into the location setting hole 315 of the shield panel 310.

In addition, since a fixed boss 341 that penetrates in the forward and backward direction is formed on the mounting holder 340, and a fixed hook 331, which penetrates in the rear and is formed in a hook shape on the rear surface of the plurality of radiation elements 330, penetrates through the fixed boss 341, the mounting holder 340 and the radiation element 330 can be fixed through an operation of hook-fastening the fixed hook 331 of the radiation element 330 into a fixed hole 311 formed to penetrate before and after the shield panel 310.

Meanwhile, as referenced in FIGS. 6A and 6B, the feed terminal 320 combined with the front part of the shield panel 310 through the above-described mounting holder 340 may include a filter side terminal 321 electrically connected to the filter 500 through the feed hole 313 of the shield panel 310, and a radiation element side terminal 322 branched from the filter side terminal 321 and electrically connected to the plurality of radiation elements 330.

That is, a plurality of feed terminals 320 provided with feed available to a plurality of paths may be fixedly installed on one shield panel 310 through the mounting holder 340, and each of the plurality of radiation elements 330 may be connected to the radiation element side terminal 322 among the plurality of feed terminals 320.

Here, the plurality of radiation elements 330 may be radiation elements which are disposed in two rows to be spaced apart from each other by 5 in the up and down direction on the front surface of the shield panel 310, and which adopt a patch type capable of implementing at least one of dual polarization frequencies.

Accordingly, the radiation element side terminal 322 may be branched from the filter side terminal 321 on one side and the other side of each radiation element 330, and may be connected to a predetermined rear surface side part of the radiation element 330 so as to be able to implement one of the dual polarization frequencies as described above. In this case, at a front end part of the radiation element side terminal 322, a terminal fixing hole 324 may be formed to be fitted and fixed to a terminal fixing protrusion 343 formed on the mounting holder 340.

Meanwhile, the top and bottom length and the left and right width of the shield panel 310 are set to be acceptable in the above-described front protrusion accommodation part 115, and as described above, it is preferable that the shield panel 310 is formed long in the up and down direction.

As described above, since the plurality of filters 500 are arranged in the up and down direction in the filter accommodation groove 116 of the front protrusion accommodation part 115, and the antenna element assembly 300 are stacked and disposed in front of the plurality of filters 500, the system heat generated from the first heating element group 411 and the second heating element group 412 of the main board 410 is smoothly branched and dissipated to the front through the plurality of front heat dissipation fins 111 and 112 corresponding to the left side part and the right side part of the front protrusion accommodation part 115, and thus it is possible to establish a small cell network.

Further, the antenna apparatus 1 according to an embodiment of the present disclosure can greatly reduce space constraints since the rear surface of the antenna housing part 100 (i.e., rear surface of the rear housing part 110) is installed to be in surface contact with the indoor or outdoor installation wall surface W through the installation plate 600, and can also provide an advantage of easily dissipating the system heat generated inside the antenna housing part 100 onto the front surface of the front housing 110 without thermal interferences.

As above, an antenna apparatus according to an embodiment of the present disclosure has been described in detail with reference to the accompanying drawings. However, embodiments of the present disclosure are not necessarily limited to the above-described embodiment, but it will be apparent that various modifications and implementation within an equal scope are possible by those of ordinary skill in the art to which the present disclosure pertains. Accordingly, the true scope of the present disclosure should be interpreted by the appended claims.

INDUSTRIAL APPLICABILITY

The present disclosure provides an antenna apparatus which can reduce restrictions of an installation space against an indoor or outdoor installation wall surface.

The invention claimed is:

1. An antenna apparatus comprising:
   an antenna housing part having a front surface on which a plurality of front heat dissipation fins are integrally formed;
   an antenna element assembly stacked and disposed on the front surface of the antenna housing part, and disposed to be exposed to the front between the plurality of front heat dissipation fins formed on a left side part and a right side part of the antenna housing part;
   a plurality of filters disposed on a rear part of the antenna element assembly, and disposed in an installation space inside the antenna housing part; and
   an installation plate having a front surface fixed in surface contact with rear surfaces of the antenna housing parts and a rear surface installed in surface contact with an installation wall surface to mediate the installation of the antenna housing part,
   wherein the antenna housing part comprises:
   a front housing having a border end part protruding to the front as much as a front protrusion height of the plurality of front heat dissipation fins, and a front protrusion accommodation part formed thereon and configured to accommodate the plurality of filters and a plurality of antenna element assemblies therein; and
   a rear housing disposed to cover an open rear surface of the front housing and configured to be in surface contact with a front surface of the installation plate.

2. The antenna apparatus of claim 1, further comprising a radome combined with the border end part that is a front end of the front protrusion accommodation part of the front housing.

3. The antenna apparatus of claim 1, wherein the plurality of antenna assemblies comprise a shield panel disposed inside the front protrusion accommodation part, and disposed to shield front surfaces of the plurality of filters accommodated in the front protrusion accommodation part.

4. The antenna apparatus of claim 1, wherein the front protrusion accommodation part is formed in the middle that is between the plurality of front heat dissipation fins provided in the two places, and is formed long in an up and down direction.

5. The antenna apparatus of claim 1, wherein the plurality of front heat dissipation fins are vertically formed long in an up and down direction, and are formed to be spaced apart for a predetermined distance from the adjacent front heat dissipation fins in a left and right direction.

6. The antenna apparatus of claim 1, wherein the installation plate is formed in the shape of a vertical panel that comes in surface contact with even the installation wall surface, and is made of a thermally conductive material.

7. The antenna apparatus of claim 1, wherein the heating element mounted on the main board is mounted so that a front surface thereof comes in thermal surface contact with a rear surface thereof corresponding to an immediate rear of the plurality of front heat dissipation fins of the front housing.

8. The antenna apparatus of claim 7, wherein the heating element mounted on the main board comprises a first heating element group disposed in the immediate rear of the left heat dissipation fins formed on a left side part among the plurality of front heat dissipation fins, and a second heating element group disposed in the immediate rear of the right heat dissipation fins formed on a right side part among the plurality of front heat dissipation fins; and wherein on a rear part of the front housing, a plurality of heat transfer grooves corresponding to front protrusion shapes of the first heating element group and the second heating element group are integrally processed and formed.

9. The antenna apparatus of claim 7, wherein a PSU board is disposed on a lower part of the main board side by side, and wherein a PSU related element mounted on the PSU board has a front surface that is disposed to be in close contact with a rear part of the front housing.

10. An antenna apparatus comprising:

an antenna housing part having a predetermined installation space formed therein and provided with a plurality of front heat dissipation fins protruding to at least one side of a front surface thereof;

a main board stacked and disposed in the installation space of the antenna housing part, having predetermined heating elements mounted and disposed on a front surface thereof, and mounted to be in thermal contact with the front surface of the antenna housing part provided with the plurality of front heat dissipation fins;

a plurality of filters configured to form a predetermined layer in front of the main board and stacked and disposed on a middle portion excluding a place where the plurality of front heat dissipation fins are formed;

an antenna element assembly provided with a plurality of radiation elements stacked and disposed in front of the plurality of filters; and an installation plate fixed to be in surface contact with a rear surface of the antenna housing part and configured to mediate a surface contact installation on a vertically disposed installation wall surface.

11. An antenna apparatus comprising:

an antenna housing part having a predetermined installation space formed therein and provided with a plurality of front heat dissipation fins protruding from left and right side parts to the front around a middle portion of a front surface thereof, the plurality of front heat dissipation fins being divided into two places;

a main board stacked and disposed in the installation space of the antenna housing part, having predetermined heating elements mounted and disposed on a front surface thereof, and mounted to be in thermal contact with an inner surface of the antenna housing part provided with the plurality of front heat dissipation fins;

a plurality of filters configured to form a predetermined layer in front of the main board and stacked and disposed on a middle portion excluding the place where the plurality of front heat dissipation fins are formed;

an antenna element assembly provided with a plurality of radiation elements stacked and disposed on the front surface of the antenna housing part corresponding to the front of the plurality of filters; and an installation plate fixed to be in surface contact with a rear surface of the antenna housing part and configured to mediate a surface contact installation on a vertically disposed installation wall surface.

12. The antenna apparatus of claim 11, further comprising a front housing, wherein at least one screw fastening hole is formed on the installation plate, and wherein on a border of the front housing, a screw fastening end for fastening an assembly screw is formed at a location corresponding to the screw fastening hole.

13. The antenna apparatus of claim 12, wherein at the screw fastening end, a screw locking groove, which is locked in a gravity direction in a head part protruding in the front after the installation plate is fixed so that a rear surface thereof comes in surface contact with the installation wall surface by the assembly screw, is formed in a downwardly open "U" shape.

\* \* \* \* \*